(12) United States Patent
Eshleman

(10) Patent No.: US 7,320,930 B2
(45) Date of Patent: Jan. 22, 2008

(54) MULTI-ELEVATION SINGULATION OF DEVICE LAMINATES IN WAFER SCALE AND SUBSTRATE PROCESSING

(75) Inventor: Dean Eshleman, Streetsboro, OH (US)

(73) Assignee: HANA Microdisplay Technologies, Inc., Twinsburg, OH (US)

( * ) Notice: Subject to any disclaimer, the term of this patent is extended or adjusted under 35 U.S.C. 154(b) by 217 days.

(21) Appl. No.: 10/828,110

(22) Filed: Apr. 19, 2004

(65) Prior Publication Data
US 2005/0233549 A1 Oct. 20, 2005

(51) Int. Cl.
*H01L 21/46* (2006.01)
*H01L 29/74* (2006.01)

(52) U.S. Cl. ...................... 438/462; 257/113
(58) Field of Classification Search ........ 438/460–465, 438/975, 110, 113; 257/620, 770
See application file for complete search history.

(56) References Cited

U.S. PATENT DOCUMENTS

| | | | |
|---|---|---|---|
| 3,680,213 A * | 8/1972 | Reichert | 33/18.1 |
| 5,059,899 A | 10/1991 | Farnworth et al. | |
| 5,832,601 A | 11/1998 | Eldridge et al. | |
| 5,963,289 A * | 10/1999 | Stefanov et al. | 349/187 |
| 6,150,240 A * | 11/2000 | Lee et al. | 438/460 |
| 6,422,227 B1 * | 7/2002 | Kobayashi et al. | 125/13.01 |
| 6,568,384 B1 | 5/2003 | Onizaki | |
| 2002/0114507 A1 | 8/2002 | Lynch et al. | |
| 2002/0162438 A1 | 11/2002 | Lim et al. | |
| 2003/0232488 A1* | 12/2003 | Chua et al. | 438/460 |
| 2004/0180514 A1* | 9/2004 | Chao et al. | 438/460 |

* cited by examiner

*Primary Examiner*—Calvin Lee
(74) *Attorney, Agent, or Firm*—Roetzel & Andress

(57) ABSTRACT

Wafer scale and substrate processing device singulation methods, and devices made by the methods, for singulation of discrete devices from a processed wafer or laminated structures, involves formation of separation scribes or saw cuts at multiple elevations in intersecting scribe streets or lines so that a separation cut in one direction is at a different depth than a separation cut in a different and intersecting direction. Separation or fracture of the wafer or laminated structure along one of the separation cuts does not transfer to the separation line of the intersecting separation cut due to the difference in depth of the intersecting cuts or scribes, and due to the difference in elevation of the bottom surfaces of the cuts or scribes within the scribe streets, resulting in cleaner edges on the separated devices.

16 Claims, 1 Drawing Sheet

US 7,320,930 B2

MULTI-ELEVATION SINGULATION OF DEVICE LAMINATES IN WAFER SCALE AND SUBSTRATE PROCESSING

FIELD OF THE INVENTION

The present invention pertains to wafer scale and substrate processing and fabrication of electronic devices, and more particularly to singulation of discrete die or chip components from processed wafers or substrates or other structures of glass, silicon or other materials or laminated layers of materials.

BACKGROUND OF THE INVENTION

Wafer scale processing of semiconductor materials or laminates which include semiconductor material require singulation of discrete components or chips or dies by saw separation of the wafer. The chips are demarcated by scribe lines in the form of alleys which contain no circuitry or bond pads, where mechanical separation by sawing can be performed without damage to the circuitry on the dies. There are many challenges and risks associated with saw separation of device dies from wafers, including fragility of the dies and the need for cooling water, de-ionization agents, debris contamination and the possibility of partial or total damage of the wafer. Therefore, careful process control of saw scribe separation is required. Improvements to automated wafer singulation saw equipment has helped in these respects, as described for example in U.S. Pat. Nos. 5,059,899; 6,150,240 and 6,568,384, but have not adequately addressed all of these factors and the special challenges presented by laminated wafer dies.

Scaled production of laminated devices, such as glass-on-silicon and glass-on-glass as used for example in liquid-crystal-on-silicon (LCoS) and reflective LCoS devices, requires clean saw separation of all of the layers of the laminate. Differences in material properties of the layers can result in rough or flared edges in one or more layers of the laminate. Non-square edges cause problems when aligning these types of devices with one another or to other mechanical edges. It would be desirable for the singulation process to result in separate laminate dies with optimally smooth edges for subsequent processing.

SUMMARY OF THE INVENTION

The invention provides an improved method and process for separation of laminate structures, included laminates of processed devices such as wafer-scale processed electronic devices, silicon or other semiconductor devices. In accordance with one general aspect of the invention, there is provided a method of manufacturing a plurality of devices from a wafer having scribe streets for receiving cuts by which the wafer is separated into a plurality of devices, including the steps of forming a first cut in a first scribe street to a first depth; forming a second cut in a second scribe street to a second depth; separating the wafer generally along the first cut, and further separating the wafer generally along the second cut into a plurality of devices. In a preferred embodiment of the invention, a first cut which is formed in the wafer is of a shallower depth relative to a second cut formed in the wafer. Also in a preferred embodiment of the invention, individual devices are separated from the wafer first by separation along first or second cuts which are relatively deeper than remaining first or second cuts.

In accordance other embodiments and aspects of the invention, there is described a processed wafer with multiple devices formed thereon and arranged in a matrix with intersecting first and second scribe streets between the devices, with first cuts in the first scribe streets to a first depth, and second cuts in the second scribe streets to a second depth. And a laminated structure with multiple devices and a plurality of intersecting scribe streets between the devices; a plurality of separation cuts made in the scribe streets for separation of the devices along the separation cuts, at least one of the separation cuts having a depth dimension different than a depth dimension of another of the separation cuts in the laminated structure.

These and other aspects and embodiments of the invention are described herein in detail with reference to the accompanying Drawings.

DETAILED DESCRIPTION OF PREFERRED AND ALTERNATE EMBODIMENTS

Figure 1:
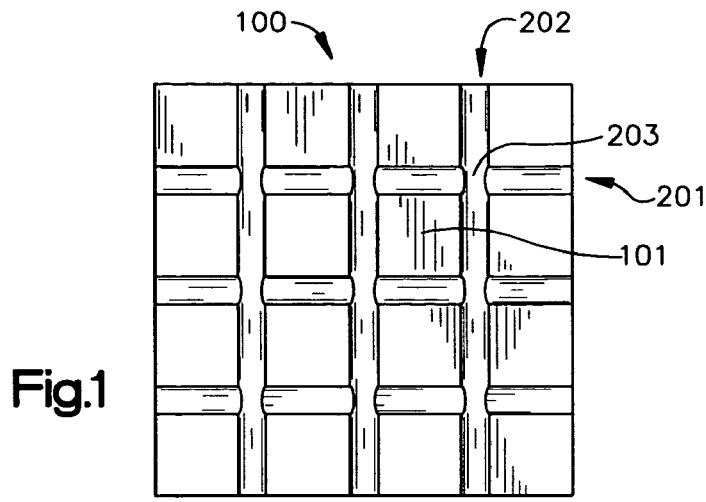
FIG. 1 is a top view of a laminated processed wafer for singulation in accordance with the present invention.

As shown in FIG. 1, a typical processed wafer 100 contains multiple devices or dies 101, separated by scribe streets or lines 201 and 202 which are most commonly made in the orthogonal arrangement shown, but which may be in any pattern, and which may cross at multiple intersections 203 as shown. The processed wafer may be one of several layers of a laminate 1000, which includes a first or top layer 1001, one or more intermediate layers 1002, 1003, and one or more bottom or substrate layers 1004. Any of the layers of the laminate 1000 can be of any material known in the art, such as a layer of any semiconductor material, insulating layers, active layers, doped layers, reflective layers and structural or adhesive layers. Also, additional layers may be added to the laminate structure before or after the described singulation process. As used herein, the terms "wafer", "laminate", "laminate structure" and "structure" refer to any type or combination of materials in generally planar form and on or in which devices—such as any type of liquid crystal devices—are formed, and in which cuts or scribes are made to separate devices from the material.

Figure 2:
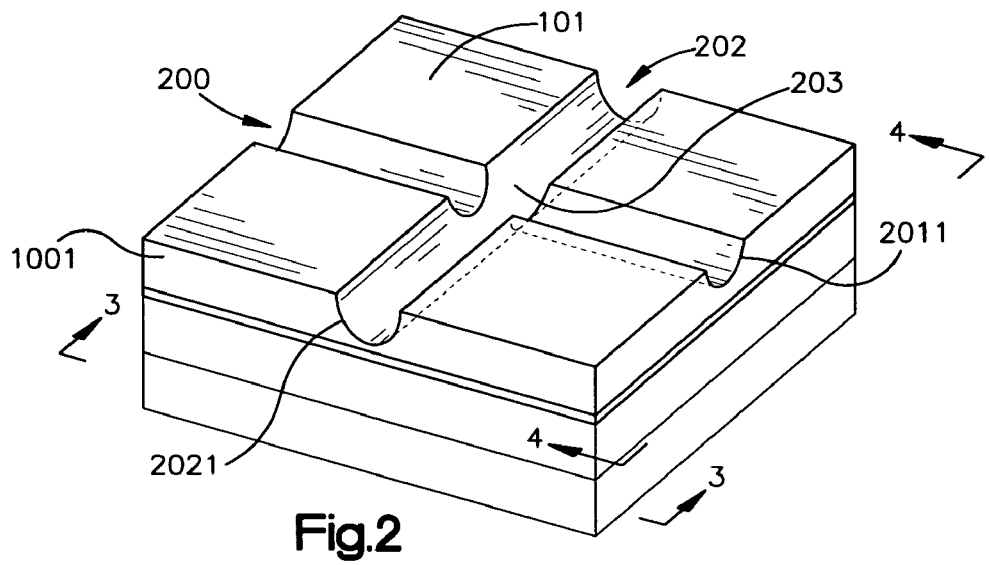
FIG. 2 is a perspective view of a laminated structure cut for singulation in accordance with the present invention.
Figure 3:
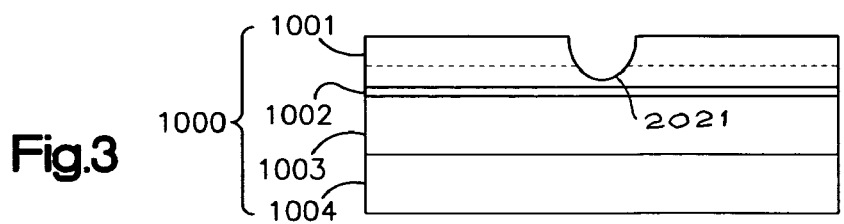
FIG. 3 is an elevation in the direction of the arrows 3-3 in FIG. 1 of a laminated structure cut for singulation in accordance with the present invention.
Figure 4:
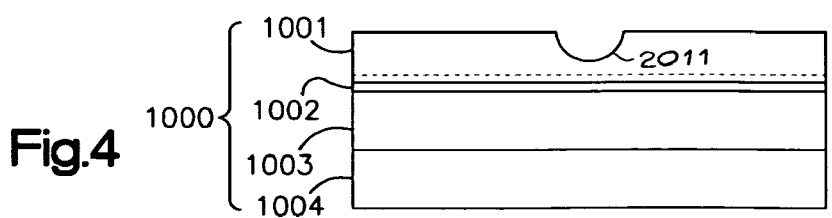
FIG. 4 is an elevation in the direction of the arrows 4-4 in FIG. 1 of a laminated structure cut for singulation in accordance with the present invention.

The laminate structure provides the processing advantage of allowing partial depth cuts in the scribe streets through the cross-section of the laminate. The present invention exploits this physical characteristic of a laminate structure by making a first separation cut 2011 in a first scribe line or scribe line direction, such as in one or more of scribe lines 201, to a first depth as shown in FIGS. 2 and 3. Cut 2011 may be to a depth, for example, which extends substantially through the top layer 1001 or closely proximate to an interface between the top layer 1001 and the immediate underlying intermediate layer, or completely through the top layer 1001 and into the immediately underlying layer or layers. The first cut 2011 is preferably to the least extent into the cross-section of the laminate 1000, but conversely can be the deepest of cuts in the separation process.

Once the desired number of cuts 2011 are made in the aligned and common directions of scribe lines 201, a second cut or series of cuts 2021 are made within the scribe lines 202 which intersect scribe lines 201, and preferably at a depth which differs from the depth of cuts 2011. In the preferred process wherein cuts 2011 are formed first and to the least extent into the laminate cross-section, cuts 2021 are made second to a greater extent, i.e., deeper, than cuts 2011. Thus, as shown in FIG. 2, cuts 2011 do not touch the bottom or trough of cuts 2021 at the intersections 203. The invention however is not limited to the relative orientation, order or depths of the cuts 2011, 2021. For example, cuts 2011 can be made shallower than cuts 2021, or the shallow cuts made prior to formation of the relatively deeper cuts.

With the laminate 1000 thus scribed or cut to multiple depths in intersecting lines, it is ready for singulation of the dies as separated by the cuts. Preferably, the laminate 1000 is separated or broken along the deeper of the cuts first, which allows the break to propagate along the trough of the deepest cut without interference by the intersecting but shallower cuts. Because the break occurs in a layer or layers of the laminate 1000 at the bottom trough of the deepest cut, the break does not see the intersecting shallower cuts and therefore stays linear and within the parameters of the deepest cut. With the laminate 1000 thus separated into strips along one linear dimension of the deepest cuts, 2011 or 2021, it can then be subsequently separated into individual dies by separation along the relatively shallower cuts which are transverse to the length of the strips. In the illustrated example, the laminate 1000 is first separated along cuts 2021, and then separated along cuts 2011 into individual dies. The method of singulation of a wafer into separate dies thus involves the steps of forming one or more scribes or saw cuts in a first direction to a first depth; forming one or more scribes or saw cuts in a second direction to a second depth; separating the wafer along the first or second scribes or saw cuts, and further separating the wafer along the first or second scribes or saw cuts. Preferably, the wafer is separated first along the deepest of the scribes or saw cuts. Because the secondary relatively shallower cuts are no longer intersected by any cuts, the risk of errant separation or irregular fracture between the dies is greatly reduced. With the resulting cleaner separation and demarcation of the die edges, the dies are in better condition for subsequent handling, processing and combining with other components. Because the invention relies in part upon the relative depths of intersecting scribes or saw cuts, the invention is not limited to the physical manner in which the scribes or saw cuts are formed in the wafer or other laminated structure.

What is claimed as the invention is:

1. A method of manufacturing a plurality of devices from a structure having intersecting scribe streets in which cuts are made along which to separate the structure into a plurality of devices, the method comprising the steps of:

forming a first cut in a first scribe street on the structure to a first depth which does not extend through the structure;

forming a second cut in a second scribe street which intersects the first scribe street on the structure to a second depth different than the first depth and which also does not extend through the structure;

separating the structure generally along the first cut, after forming the first cut and the second cut; and further separating the structure generally along the second cut into a plurality of devices.

2. The method of claim 1 wherein the first depth of the first cut is greater than the second depth of the second cut.

3. The method of claim 1 wherein the second depth of the second cut is greater than the first depth of the first cut.

4. The method of claim 1 wherein the structure is in the form of a laminate with multiple layers and the first cut is made substantially through a top layer of the laminate.

5. The method of claim 1 wherein the structure is in the form of a laminate with multiple layers and the second cut is made substantially through a top layer of the laminate.

6. The method of claim 1 wherein the structure is in the form of a laminate with multiple layers and the structure is separated through each of the layers of the laminate generally along the first and second cuts.

7. A processed laminated structure having multiple devices formed thereon and arranged in a matrix with intersecting first and second scribe streets between the devices, first cuts in the first scribe streets to a first depth which does not extend through all layers of the laminated structure, and second cuts in the second scribe streets to a second depth which is greater than the first depth and which does not extend through all layers of the laminated structure.

8. The processed structure of claim 7 wherein the first and second scribe streets are perpendicular.

9. The processed structure of claim 7 wherein the first and second cuts are saw cuts.

10. The processed structure of claim 7 wherein the first and second cuts are scribes.

11. The processed structure of claim 7 wherein intersections of the first and second streets have a cut depth which is the same as the deepest of the first or second cuts.

12. An un-separated laminated structure having multiple devices and a plurality of intersecting scribe streets between the devices;

a plurality of separation cuts made in the scribe streets for separation of the devices along the separation cuts, at least one of the separation cuts having a depth dimension different than a depth dimension of another of the separation cuts in an intersecting scribe street in the laminated structure.

13. The laminated stmcture of claim 12 wherein the laminated structure includes a silicon layer, a reflective layer, and a circuitry layer.

14. The laminated structure of claim 13 wherein the circuitry layer includes circuitry for devices operative to control a liquid crystal cell.

15. The laminated structure of claim 12 wherein the separation cuts are saw cuts.

16. The laminated structure of claim 12 wherein the separation cuts are scribes.

* * * * *